United States Patent
Filipovic

(10) Patent No.: US 7,430,406 B2
(45) Date of Patent: Sep. 30, 2008

(54) GAIN CONTROL IN A WIRELESS DEVICE

(75) Inventor: Daniel F. Filipovic, Solana Beach, CA (US)

(73) Assignee: QUALCOMM Incorporated, San Diego, CA (US)

( * ) Notice: Subject to any disclaimer, the term of this patent is extended or adjusted under 35 U.S.C. 154(b) by 86 days.

(21) Appl. No.: 10/290,577

(22) Filed: Nov. 8, 2002

(65) Prior Publication Data

US 2004/0092238 A1    May 13, 2004

(51) Int. Cl.
   *H04B 1/06* (2006.01)
(52) U.S. Cl. ............... 455/240.1; 455/250.1; 455/340; 375/345
(58) Field of Classification Search ........... 455/230, 455/232.1, 234.1, 240.1, 241.1, 245.1, 245.2, 455/250.1; 375/345, 339, 341
See application file for complete search history.

(56) References Cited

U.S. PATENT DOCUMENTS

| | | | |
|---|---|---|---|
| 6,212,244 B1 * | 4/2001 | Davidovici et al. | 375/345 |
| 6,498,927 B2 * | 12/2002 | Kang et al. | 455/245.2 |
| 6,804,501 B1 * | 10/2004 | Bradley et al. | 455/138 |
| 6,993,291 B2 * | 1/2006 | Parssinen et al. | 455/67.11 |
| 7,024,169 B2 * | 4/2006 | Ciccarelli et al. | 455/232.1 |
| 2002/0068540 A1 * | 6/2002 | Skarman et al. | 455/232.1 |
| 2002/0160734 A1 * | 10/2002 | Li et al. | 455/245.1 |
| 2003/0022642 A1 * | 1/2003 | Kwun | 455/136 |
| 2003/0078007 A1 * | 4/2003 | Parssinen et al. | 455/67.1 |
| 2003/0083031 A1 * | 5/2003 | Eriksson et al. | 455/250.1 |
| 2003/0194028 A1 * | 10/2003 | Jeffers et al. | 375/345 |

FOREIGN PATENT DOCUMENTS

| | | |
|---|---|---|
| DE | 19805547 | 2/1998 |
| EP | 1020991 | 7/2000 |
| JP | 0164 62 | 1/2002 |

* cited by examiner

*Primary Examiner*—Edward Urban
*Assistant Examiner*—Nhan T. Le
(74) *Attorney, Agent, or Firm*—Howard H. Seo; William Marcus Hooks; Thomas R. Rouse

(57) ABSTRACT

This disclosure is directed to techniques that can be executed by a wireless device to perform various signal processing tasks associated with wireless communication. The techniques involve gain state switching based on an output of an analog-to-digital (A/D) converter, rather than gain state switching techniques in which an estimation of signal strength at the antenna is mapped to gain states. Use of the A/D converter output for gain state selection can provide more accurate and dynamic switchpoints.

15 Claims, 3 Drawing Sheets

GAIN CONTROL IN A WIRELESS DEVICE

FIELD

This disclosure relates to wireless communication and, more particularly, to gain control in a wireless device.

BACKGROUND

A number of different wireless communication techniques have been developed, including frequency division multiple access (FDMA), time division multiple access (TDMA) and various spread spectrum techniques. One common spread spectrum technique used in wireless communication is code division multiple access (CDMA) signal modulation in which multiple communications are simultaneously transmitted over a spread spectrum radio-frequency (RF) signal. Some example wireless devices that have incorporated CDMA technology include mobile phones such as cellular and satellite radiotelephones, PCMCIA cards incorporated within portable computers, personal digital assistants (PDAs) equipped with wireless communication capabilities, and the like.

Wireless networking techniques have also been developed in order to allow wireless devices to share information and resources via wireless communication. Examples of wireless devices used in wireless networks include laptop or desktop computers, personal digital assistants (PDAs), mobile phones, data terminals, data collection devices, household appliances, and other portable and non-portable wireless computing devices.

One family of standards developed to facilitate wireless networking is set forth in the IEEE 802.11 standard. The original IEEE 802.11 standard provides wireless data transfer rates of 1-2 Megabits per second (Mbps) in a 2.4-2.483 Gigahertz (GHz) frequency band (hereafter the 2.4 GHz band). However, a number of extensions to the original IEEE 802.11 standard have been developed in an effort to increase wireless data transfer rates.

The IEEE 802.11b standard (sometimes referred to as 802.11 wireless fidelity or 802.11 Wi-Fi) provides 11 Mbps transmission, with a fallback to 5.5, 2.0 and 1.0 Mbps in the 2.4 GHz band. The IEEE 802.11g standard is another extension of the IEEE 802.11 standard. The IEEE 802.11g standard utilizes orthogonal frequency division multiplexing (OFDM) in the 2.4 GHz frequency band to provide data transmission at rates up to 54 Mbps. The IEEE 802.11g standard also provides backwards capability with 802.11b networks. The IEEE 802.11a standard is an extension of IEEE 802.11 standard that utilizes OFDM in a 5 GHz frequency band to provide data transmission at rates up to 54 Mbps. Other wireless networking protocols include "Bluetooth protocols" developed by the Bluetooth Special Interest Group. Additional extensions to the IEEE 802.11 standard, as well as other wireless local area network (WLAN) standards will likely emerge in the future.

Wireless receivers typically make gain adjustments to the received signal via analog closed-loop automatic gain control (AGC). Then, once the received signal has been scaled, the scaled signal can be examined or measured in order to determine whether the signal corresponds to an information signal supported by the system. If so, demodulation of the wireless signal can be performed.

More recently, discrete gain states have been implemented in wireless devices in lieu of, or in addition to analog AGC. When discrete gain states are used, the wireless device scales a received signal by selecting one of a plurality of discrete gain states. Typically, the wireless device selects the gain state based on an estimated signal strength of the received signal, i.e., an estimate of signal power at the antenna of the receiving device. If the estimated power of the received signal at the antenna is too low, the gain state can be selected to increase one or more gains used in signal conditioning. Alternatively, if the estimated power of the received signal at the antenna is too high, the gain state can be selected to decrease the gain(s). For example, after estimating the signal strength at the antenna, the estimated signal strength may be mapped to the most desirable gain state, which in turn maps to one or more gains applied at amplifiers, mixers, or other signal conditioning components.

The term "switchpoints" refer to the estimated signal strengths at which gain state switching occurs. Calibration of the switchpoints is conventionally performed, in which wireless devices are tested to define switchpoints that can be programmed into the wireless devices. Such calibration can be very costly and time consuming, increasing the manufacturing cost of wireless devices. Moreover, calibration to account for temperature effects and frequency offsets is often performed based on the measured characteristics of only a subset of the devices. These calibration concerns, as well as challenges in signal strength estimation, may cause inaccuracy in switchpoints, which in turn can affect performance of the wireless device.

SUMMARY

In general, this disclosure is directed to techniques that can be executed to control one or more gains within a wireless device, such as a gain of analog amplifiers, mixers, or other signal conditioning components. The techniques involve gain state switching based on a digital representation of a received signal produced by an analog-to-digital (A/D) converter, rather than gain state switching based on an estimate of received signal strength at the receive antenna. Use of the A/D converter output for gain state selection can provide greater switchpoint accuracy and cause dynamic adjustment of switchpoints to adapt to changing conditions.

In one embodiment, a method includes receiving a wireless signal and conditioning the wireless signal based on a gain state, the gain state being one of a plurality of discrete gain states for conditioning the signal. For example, conditioning the signal may comprise, amplifying the signal, attenuating the signal, mixing the signal to baseband, or any other signal conditioning that may use a gain defined by a selected gain state. The method may further include converting the conditioned signal to a digital value and selecting the gain state based on the digital value.

Various embodiments may be implemented in a wireless device in software, hardware, firmware, or any combination thereof. If implemented in software, the techniques may be embodied in a computer readable medium comprising instructions that cause the wireless device to perform the techniques. Additional details of various embodiments are set forth in the accompanying drawings and the description below. Other features, objects and advantages will become apparent from the description and drawings, and from the claims.

DETAILED DESCRIPTION

Figure 1:
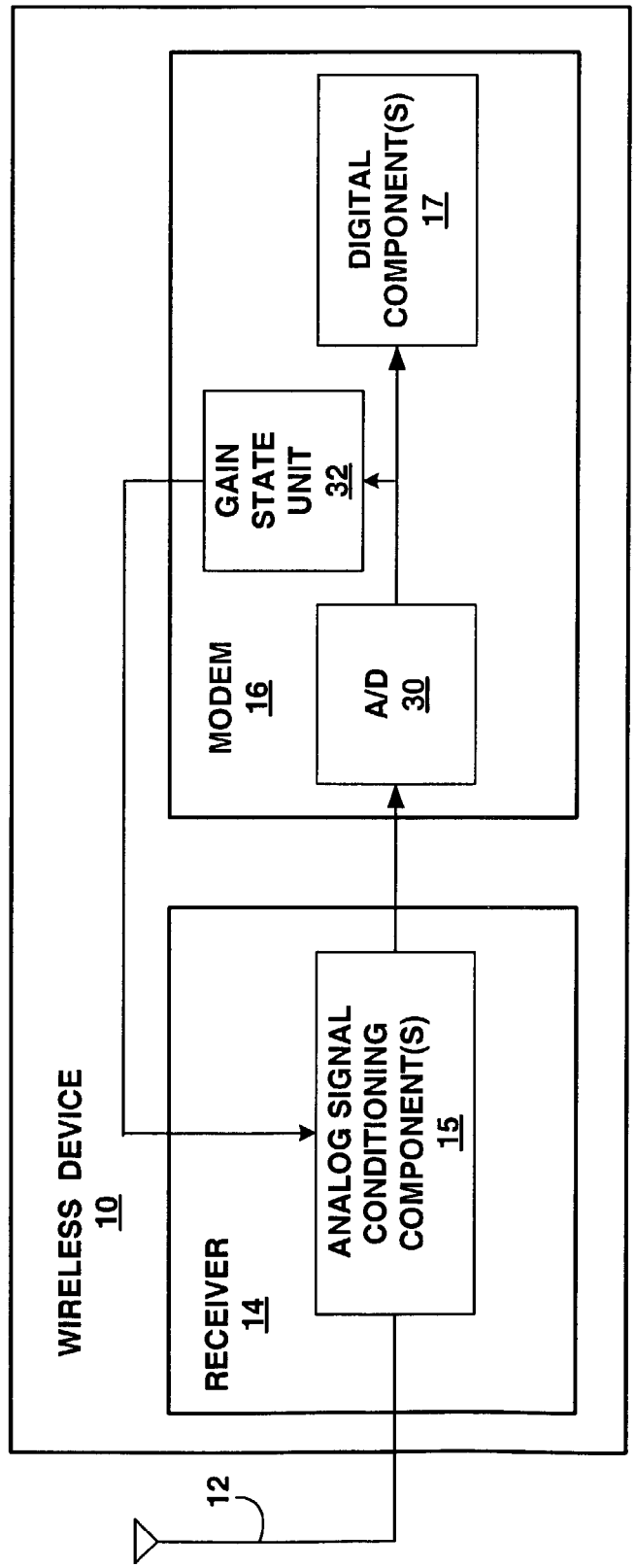
FIG. 1 is a block diagram illustrating a wireless device that can implement one or more of the techniques described herein.

This disclosure describes a wireless device configured to perform various signal processing tasks associated with wireless communication. For example, the wireless device may comprise a device used in wireless voice communication, wireless networking or both. In any case, the wireless device performs signal conditioning according to discrete gain states, in lieu of or in addition to implementing conventional analog closed-loop automatic gain control (AGC). In this disclosure, the term signal conditioning refers to amplification of a signal, attenuation of a signal, mixing of a signal, or any other signal processing that may use a gain to adjust or affect the signal. The implementation of discrete gain states may improve and/or simplify the wireless device by eliminating or simplifying analog closed-loop AGC. Discrete gain states can greatly simplify signal conditioning by reducing complexity of amplifiers, mixers and/or other signal conditioning components.

More specifically, the techniques described in this disclosure implement gain state switching based on a digital representation of a received signal produced as the output of an analog-to-digital (A/D) converter. Thus, the techniques need not rely on gain state switching based on estimation of received signal strength at the antenna of the wireless communication device. For example, the direct output of the A/D converter, or a digitally filtered output of the A/D converter may be used as a basis for gain state switching. In either case, use of the A/D converter output for gain state selection can provide improved switchpoint accuracy and cause dynamic adjustment of switchpoints to adapt to changing conditions.

Switchpoints refer to received signal strengths at which gain state switching occurs, and are conventionally fixed at various estimated signal strengths. In the techniques described herein, however, gain state switching does not occur at fixed signal strengths, but is instead based on actual effects that occur in the wireless device, such as saturation of the A/D converter. For this reason, the techniques described in this disclosure are capable of producing switchpoints that are responsive to part-to-part variations of different wireless devices, as well as many temperature effects without requiring calibration of the switchpoints. By using the output of the A/D converter for gain state selection, the switchpoints can automatically change with effects such as temperature variations and part-to-part variations. In that case, the wireless device can simply keep the output of the A/D converter within a desired output band, e.g., less than saturation and above a noise floor.

If the output of the A/D converter is above or close to a threshold, such as a known saturation point, then a different gain state can be selected to reduce gain, and thereby avoid saturation. On the other hand, if the output of the A/D converter is below a desired threshold, then a different gain state can be selected to increase gain. Accordingly, variations in part-to-part analog conditioning components and temperature effects on those components can be automatically accounted for because the output of the A/D converter changes with these effects. Moreover, the need to calculate an estimation of the signal power at the antenna, sometimes referred to as a received signal strength indicator (RSSI), for the purpose of gain state selection may also be avoided.

FIG. 1 is a block diagram illustrating a wireless device 10 configured to perform gain state selection as outlined herein. Wireless device 10 may comprise a device employing frequency division multiple access (FDMA) communication techniques, time division multiple access (TDMA) communication techniques, code division multiple access (CDMA) communication techniques, or other types of communication techniques. Alternatively, wireless device 10 may comprise a device that operates according to a wireless networking protocol such as a standardized protocol from the IEEE 802.11 family of standards, a protocol developed by the Bluetooth Special Interest Group, or the like.

By way of example, wireless device 10 may be a desktop or portable computer operating in a Windows™, Macintosh™, Unix, or Linux environment, a personal digital assistant (PDA) based on the Palm™, Windows CE, or similar operating system environments for small portable devices. Alternatively, wireless device 10 may comprise a mobile telephone such as a cellular and satellite radiotelephone, a PCMCIA card incorporated within a portable computer, a direct two-way wireless communication device, a wireless appliance, a wireless data terminal, or the like.

As shown in FIG. 1, wireless device 10 includes an antenna 12 coupled to a receiver 14, and a modem 16 coupled to the receiver 14. In some cases, antenna 12 may be coupled to a duplexer (not shown), which is in turn coupled to both receiver 14 and a transmitter (not shown) that generates the wireless signals to be transmitted from wireless device 10. For simplicity, however, the duplexer and transmitter are not illustrated.

Receiver 14 generally performs signal processing of a received analog signal, whereas modem 16 generally performs signal processing of a digital values generated from a baseband analog signal. As shown, receiver 14 includes various signal conditioning components 15 such as one or more amplifiers to scale (amplify or attenuate) a received signal, one or more mixers to mix the received signal down to baseband, one or more filters to filter a received signal or to filter the baseband signal, or other signal conditioning components. As described in detail below, one or more of these signal conditioning components operate according to discrete gain states selected by gain state unit 32 of modem 16. In particular, any signal conditioning component that operates with discrete gains may benefit from this disclosure.

An A/D converter 30 exists in wireless device 10 to perform conversion of a baseband analog signal to digital values that comprise a digital version of the baseband signal. In the description that follows, A/D converter 30 is described as being part of modem 16. However, this disclosure is not limited in that respect. In other implementations, the A/D converter may form part of receiver 14, or may be a component separate from both receiver 14 and modem 16. In any case, as described herein, gain state selection can be made based on the output of A/D converter 30, such as a direct output of the A/D converter or a digitally filtered output of the A/D converter. A gain state unit 32 can make such gain state selections and send control signals to receiver 14 consistent with the selected gain state. More specifically, gain state unit 32 sends control signals to one or more signal conditioning components 15, such as one or more amplifiers, one or more mixers, one or more filters, or any other conditioning component that can operate with a gain. Like the A/D converter, the gain state unit 30 is described as forming part of modem 16, but could alternatively be implemented as a digital control unit of receiver 14, or a component separate from receiver 14 and modem 16.

In an illustrative embodiment, receiver 14 receives RF waveforms via antenna 12. The received RF waveforms are modulated according to one or more wireless protocols supported by wireless device 10. Receiver 14 conditions the received waveform, such as by filtering and scaling the RF waveform and mixing the waveform down to a baseband frequency. Receiver 14 may implement a zero intermediate frequency (zero IF) architecture in which the waveform is mixed directly into a baseband signal without first being mixed to an intermediate frequency (IF) signal. The techniques described below, however, are not necessarily limited to Zero IF implementations, but may also be used in implementations having one or more IF sections including conventional super heterodyne architectures.

Prior to mixing the signal down to baseband (sometime referred to as the down conversion process), receiver 14 may scale the RF waveform according to a selected one of a plurality of gain states. The mixer gain may also be affected by the selected one of the plurality of gain states. In particular, the selected gain state may define a gain for one or more amplifiers, mixers, filters, or other of signal conditioning components 15 within receiver 14.

Modem 16 converts the analog baseband signal to digital values, processes the digital values, and performs demodulation to extract the encoded data. In this disclosure, the term modem refers to a component or collection of components that can perform modulation, demodulation, or both modulation and demodulation. In addition, as described herein, gain state unit 32 of modem 16 performs gain state adjustments based on A/D converter output, such as a direct output of A/D converter 30, or a digitally filtered output. In either case, gain state adjustment based on A/D converter output can provide a number of advantages including gain state switching that automatically and dynamically responds to changing conditions in receiver 14, e.g., part variations and temperature variations.

Figure 2:
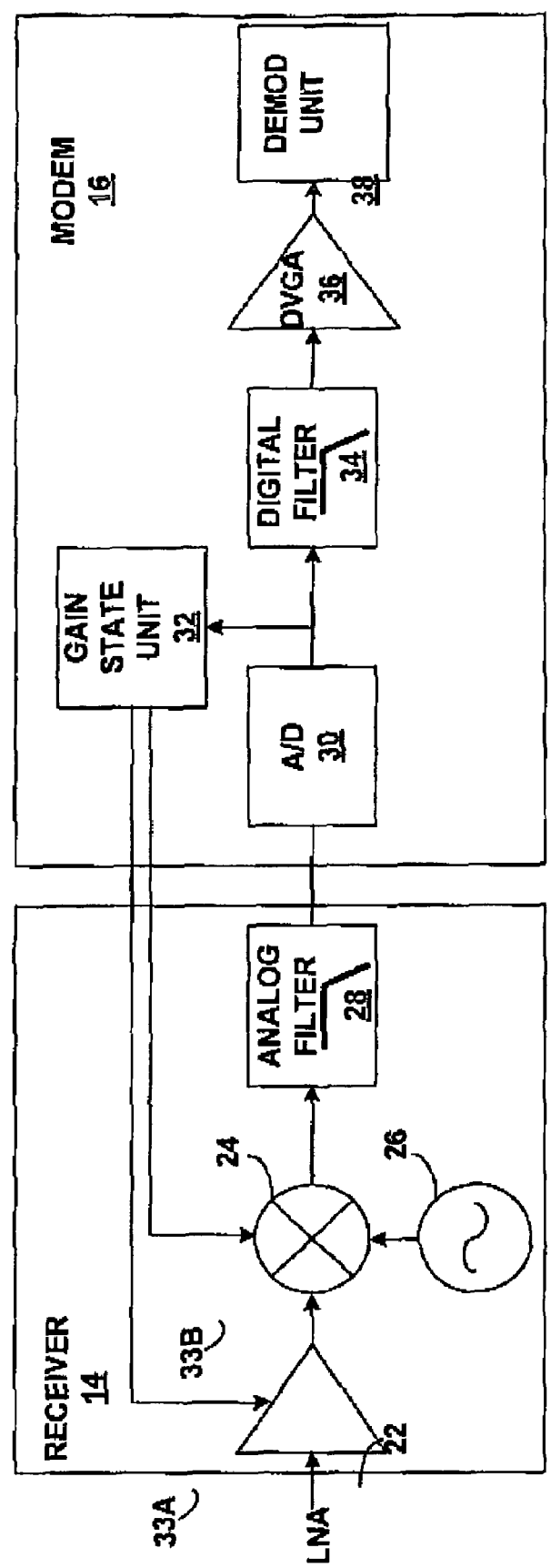
FIG. 2 is a more detailed exemplary block diagram of a receiver and modem of the wireless device depicted in FIG. 1.

FIG. 2 is a block diagram illustrating in greater detail one implementation of receiver 14 coupled to modem 16. As shown in FIG. 2, receiver 14 includes one or more amplifiers 22 such as low-noise amplifiers (LNAs) as well as one or more mixers 24. In a zero IF architecture, a mixer 24 is used to mix a received signal directly to baseband. In a heterodyne architecture, however, two or more mixers may be used. Amplifier 22 scales a received RF waveform according to the current gain state and provide the scaled signal to mixer 24. Mixer 24 receives the RF waveform from amplifier 22 and mixes it down to baseband. For example, mixer 24 may implement a frequency synthesizer that utilizes a local oscillator 26 of WCD 10 as a timing reference. Thus, mixer 24 may remove the RF carrier component of the RF waveform to generate a baseband signal. Receiver 14 may also include additional components such as one or more analog filters 28 such as a gmC lowpass filter, or other high pass, low pass or bandpass filters, depending on the modulation techniques used.

The components of receiver 14 are referred to as signal conditioning components because they condition a received RF waveform into a baseband signal that can be sent to modem 16 for conversion to digital values and subsequent demodulation. In accordance with this disclosure, one or more of the signal conditioning components of receiver 14 operate according to discrete gain states. In an illustrative example, amplifier 22 and mixer 24 operate according to discrete gain states. A first gain state may define first gains respectively for amplifier 22 and mixer 24, a second gain state may define second gains respectively for amplifier 22 and mixer 24, a third gain state may define third gains, etc. Typically, the first gain state defines the largest gains for amplifier 22 and mixer 24 in order to ensure a high level of sensitivity in receiver 14. Then, if the gains are too large, switching to the second gain state, and possibly the third gain state, etc., can be performed. In other cases, however, gain increases can be caused by the gain state switching. Also, in some cases, the gain of a given component may be the same as its gain in a different gain state. In other words, gain state switching may cause gain changes in some but not all of the components that operate according to discrete gain states.

Modem 16 includes an analog-to-digital (A/D) converter 30 and a gain state unit 32. As mentioned above, however, this disclosure is not limited to such an implementation. In other implementations, A/D converter 30, gain state unit 32, or both, may form components separate from modem 16, or may be integrated on receiver 14. In any case, gain state unit 32 selects the current gain state, stores an indication of the current gain state, and sends control signals 33A, 33B to amplifier 22 and mixer 24 respectively to define the gains of those signal conditioning components at any given instance, consistent with the current gain state.

More specifically, gain state unit 32 performs gain state selection based on the output of A/D converter 30. A/D converter 30 may receive a baseband signal and convert the baseband signal to digital values that comprise a digital version of the baseband signal. Gain state unit 32 may receive these digital values directly from A/D converter 30, and select a gain state based on the digital values. Alternatively, gain state unit 32 may receive digital values directly from digital filter 34, or another digital filter (not shown) that filters output of A/D converter 30 specifically for gain state selection purposes. In any case, the output of A/D converter 30, such as a direct output or a digitally filtered output can be used by gain state unit 32 to select a gain state.

For example, if the output of A/D converter 30 (direct or filtered) is at or greater than an upper threshold, then gain state unit 32 may select a different gain state to reduce gain at amplifier 22 and/or mixer 24. Similarly, if the output of A/D converter 30 is at or below a lower threshold, then gain state unit 32 may select a different gain state to increase gain at amplifier 22 and/or mixer 24.

In one example, the upper threshold may correspond to the saturation point of A/D converter 30. In that case, gain state switching to cause gain reductions in amplifier 22 and/or mixer 24 would occur when A/D converter 30 is at or near saturation. In other cases, the upper threshold may be selected to correspond to a point below saturation of A/D converter 30, for example, to help wireless device 10 deal with jammer signals. Jammer signals refer to noise signals that do not correspond to information signals to be demodulated. Jammer signals may be signals sent from other devices operating according to protocols not supported by wireless device 10, or signals emitted from microwave ovens, cordless telephones, other electromagnetic emitting devices, or the like. In some cases, it may be desirable to cause gain state switching even if A/D converter 30 is not saturated, e.g., in order to ensure that jammer signals are not demodulated. In other words, the threshold(s) for gain state switching based on output of A/D converter 30 may be defined so as to improve handling of jammer signals.

The lower threshold may correspond to a defined output of A/D converter 30, such as a noise floor, where it would be desirable to increase gain in order to increase the strength of A/D converter output 30. In most cases, however, gain state unit 32 begins at an initial first gain state that defines a large gain for amplifier 22 and/or mixer 24, switches to a second gain state to reduce the gain of amplifier 22 and/or mixer 24 if A/D converter 30 is saturated, switches to a third gain to further reduce the gain of amplifier 22 and/or mixer 24 if A/D converter 30 is still saturated, and so forth.

Gain state unit 32 may include logic to map A/D converter output (direct or filtered) to a gain state, or to map the A/D converter output to gain state switching events. Alternatively, gain state unit 32 may include one or more look-up tables (LUTs) to map A/D converter output (direct or filtered) to a gain state, or to map the A/D converter output to gain state switching events. Also, gain state unit 32 may include logic and/or one or more LUTs to map gain states to specific gains of the conditioning components of receiver 14, e.g., the gain of amplifier 22 and the gain of mixer 24.

By way of example, A/D converter 30 may comprise a 10-bit A/D converter or larger, that outputs 10-bit or larger digital values. Alternatively, a sigma-delta A/D converter that outputs 10-bit digital values or larger may be used. Such a relatively high dynamic range of A/D converters that output 10-bit digital values or larger can ensure adequate resolution for effective gain state switching based on such output.

The output of A/D converter 30 comprises digital values that correspond to the baseband signal in digital form. Thus, in addition to using the output of A/D converter 30 to select or adjust the gain state, the output of A/D converter 30 is also sent to various digital conditioning components, and is then demodulated. For example, as illustrated, the digital values output by A/D converter 30 are fed to low-pass digital filter 34, then to a digital variable gain amplifier (DVGA) 36. The output of DVGA 36 can then be sent to demodulation unit 38 for demodulation. In other implementations, gain state unit 32 receives digital values from digital filter 34 (or another digital filter) that correspond to filtered output of A/D converter 30. In other words, the output of A/D converter 30 used for gain state selection may be a direct output, or a digitally filtered output. In either case, problems associated with mapping a received signal strength indicator (RSSI) to gain states can be avoided, including the inability to adapt to various part-to-part variations and temperature effects that can cause drift between the relationship between an RSSI and gain states.

If desired, gain state unit 32 may also send control signals to demodulation unit 38 or the digital conditioning components to enable the digital components only once the gain state has been properly defined. In that case, gain control unit 32 may not enable DVGA 36, demodulation unit 38 or other digital components to operate until an adequate gain state has been selected. Enabling the operation of one or more digital components only when an adequate gain state has been selected may conserve power and avoid demodulation of signals that are not adequately conditioned.

Furthermore, in some implementations, wireless device 10 may incorporate multiple antennas. In that case, gain state unit 32 may also be used select an antenna in order to improve signal reception. For example, a different antenna may be selected depending on the output of A/D converter 30 (direct or filtered). Like the gains of conditioning components of receiver 14, the selected antenna may affect signal strength at the A/D converter, and thus may affect whether A/D converter 30 saturates or otherwise exceeds an upper threshold.

Once enabled, DVGA 36 scales the digital values, either by amplifying or attenuating the digital values. In particular, DVGA 36 may perform residual gain adjustments to the digital values. After scaling the digital values, DVGA 36 then forwards the scaled digital values to demodulation unit 38 for demodulation and data extraction.

Figure 3:
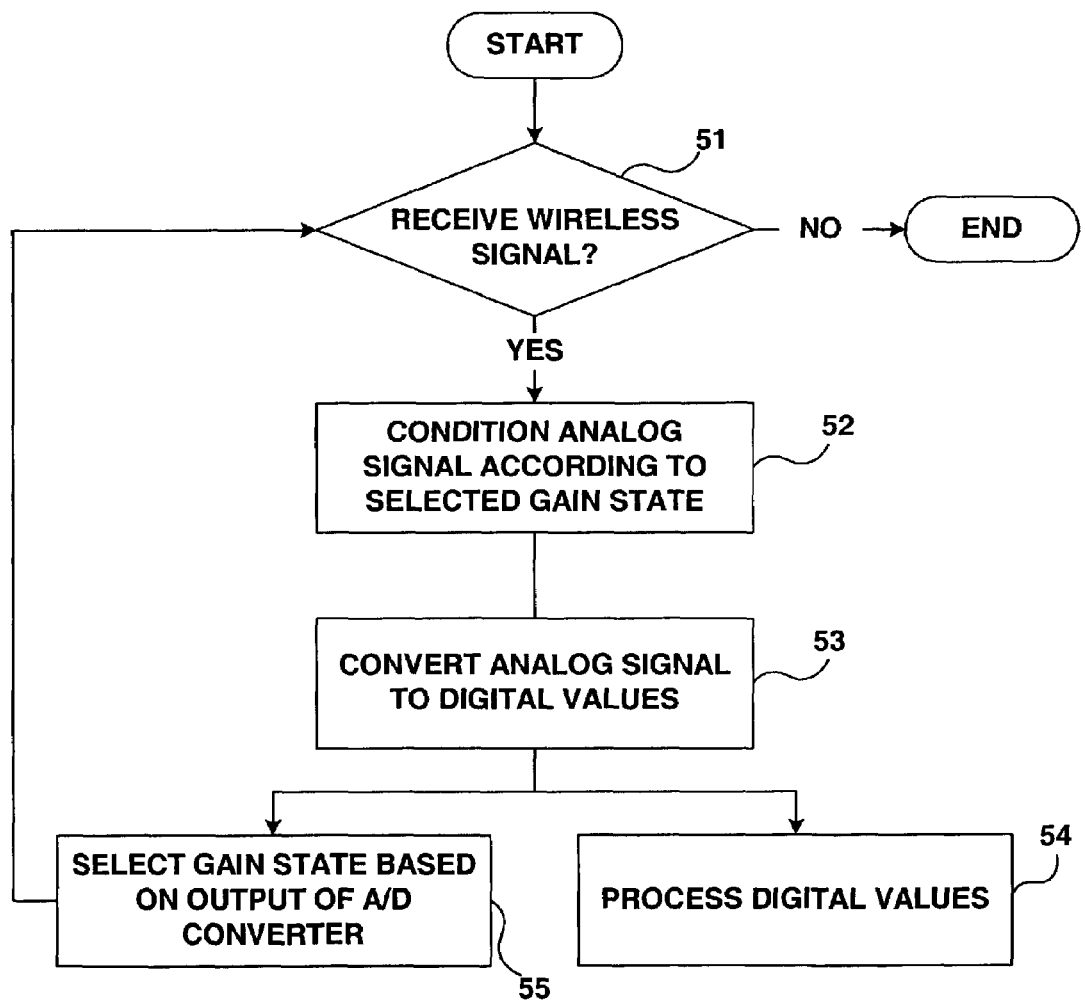
FIG. 3 is a flow diagram illustrating signal processing techniques that can be implemented in a wireless device.

FIG. 3 is a flow diagram illustrating signal processing techniques that can be implemented in wireless device 10 in accordance with this disclosure. As shown in FIG. 3, when receiver 14 of wireless device 10 receives a wireless signal, such as via antenna 12 (yes branch of 51), analog conditioning components of receiver 12 condition the analog signal according to a selected gain state (52). More specifically, amplifier 22 and mixer 24 are programmed respectively with initial gains defined by an initial gain state. After conditioning, A/D converter 30 converts the analog signal to digital values (53), and digital processing components of modem 16 process the digital values (54). As mentioned, although A/D converter 30 is illustrated in FIG. 2 as forming part of modem 16, it could alternatively form part of receiver 14, or may comprise a component separate from both modem 16 and receiver 14.

In any case, gain state unit 32 selects a gain state based on an output of A/D converter 30 (55). As mentioned, the output of A/D converter 30 used for this gain state selection may correspond to a direct output of A/D converter, or a filtered output, e.g., an output of A/D converter that is filtered by digital filter 34 or another filter specifically designed to improve the gain state selection purposes. Like A/D converter 30, gain state unit 32 may form part of modem 16 (as illustrated in FIG. 2), may alternatively form part of receiver 14, or may comprise a component separate from both modem 16 and receiver 14.

In selecting the gain state (55), gain state unit 32 may select a different gain state and send control signals to amplifier 22 and mixer 24 consistent with the different gain state. For example, if the output of A/D converter 30 is at or greater than an upper threshold, then gain state unit 32 may select a different gain state to reduce gain at amplifier 22 and/or mixer 24. Similarly, if the output of A/D converter 30 is at or below a lower threshold, then gain state unit 32 may select a different gain state to increase gain at amplifier 22 and/or mixer 24.

In one example, the upper threshold may correspond to the saturation point of A/D converter 30. In that case, gain state selection (55) causing gain reductions in amplifier 22 and/or mixer 24 would occur when A/D converter 30 is saturated. In other cases, however, the upper threshold may be defined to correspond to a point below saturation of A/D converter 30, e.g., to help wireless device 10 deal with jammer signals as discussed above.

The lower threshold may correspond to a defined output of A/D converter 30 where it would be desirable to increase gain in order to increase the strength of A/D converter output 30. In most cases, however, gain state unit 32 begins at a selected first gain state (52) that defines a large gain for amplifier 22 and/or mixer 24, A/D converter 30 converts the analog signal to digital values (53), and gain state unit 32 selects a second gain state (55) to reduce the gain of amplifier 22 and/or mixer 24 if A/D converter 30 is saturated. If the wireless signal is still being received (yes branch of 52), receiver conditions the analog signal according to the selected gain state (at this point being the second gain state) (52). A/D converter 30 converts the analog signal to digital values (53), and gain state unit 32 selects a third gain state (55) to reduce the gain of amplifier 22 and/or mixer 24 if A/D converter 30 is saturated. This process may continue with gain state adjustments until an appropriate gain state is defined that does not cause saturation of A/D converter 30 (or otherwise cause output of A/D converter 30 (direct or filtered) to exceed an upper threshold or fall below a lower threshold).

As mentioned, gain state unit 32 may include logic circuitry and/or one or more look-up tables (LUTs) to map A/D converter output to a gain state, or to map the A/D converter output to gain state switching events. In addition, gain state unit 32 may include logic circuitry and/or one or more LUTs to map gain states to specific gains of the conditioning components of receiver 14, e.g. the gain of amplifier 22 and the gain of mixer 24. In some implementations, gain state unit 32 may include logic circuitry or a LUT that maps the output of A/D converter 30 directly to specific gains of the conditioning components of receiver 14. In that case, the gain states associated with the different gains of the conditioning components of receiver 14 would be implicit in the presence of discrete gain switching.

The techniques described herein may provide a number of advantages to a wireless device. In general, the implementation of discrete gain states may improve and/or simplify the wireless device by avoiding or simplifying analog closed-loop automatic gain control. Moreover, discrete gain states can greatly simplify signal conditioning by reducing complexity of amplifiers, mixers and/or other signal conditioning components.

In addition, using the A/D converter output for gain state selection can provide more accurate and dynamic switchpoints. In other words, if the techniques described herein are used, the relationship between received signal power and gain states dynamically adjusts with variable effects such as temperature effects or part-to-part variations. For example, if temperature effects cause changes in analog conditioning components, the output of the A/D converter will reflect these changes. Accordingly, using the A/D converter output for gain state selection causes switchpoints to be dynamic, the switchpoints referring to estimated signal strengths at which gain state switching occurs.

Also, part-to-part variations can be accounted for without requiring calibration of switchpoints. If the output of the A/D converter is above a threshold (such as at saturation, or close to saturation), then a different gain state can be selected to reduce gain. On the other hand, if the output of the A/D converter is below a threshold, then a different gain state can be selected to increase gain. In this manner, variations in part-to-part analog conditioning components and temperature effects on those components can be automatically accounted for because the output of the A/D converter changes with these effects. In addition, the need to calculate an RSSI for the purpose of gain state selection may also be avoided.

Various techniques for processing wireless signals in a wireless device have been described as being implemented in hardware. Example hardware implementations may include implementations within a digital signal processor (DSP), an application specific integrated circuit (ASIC), a field programmable gate array (FPGA), a programmable logic device, specifically designed hardware components, one or more state machines, or any combination thereof. In addition, one or more of the techniques described herein may be partially or wholly executed in software. In that case, a computer readable medium may store or otherwise comprise computer readable instructions that can be executed by a wireless device to carry out one of more of the techniques described above. Various other modifications may be made without departing from the spirit and scope of this disclosure. Accordingly, these and other embodiments are within the scope of the following claims.

The invention claimed is:

1. A receiver comprising:
   circuitry that receives a wireless signal;
   circuitry that conditions the wireless signal into a conditioned wireless signal based on a current gain state;
   an analog-to-digital converter to convert the conditioned wireless signal to a digital value; and
   a control unit to directly compare the digital value to a threshold value and to choose a selected gain state based on the direct comparison of the digital value to an upper threshold value and a lower threshold value,
   wherein the selected gain state is chosen from a sequence of discrete gain states,
   wherein the selected gain state is one of being immediately lower and immediately higher in the sequence in relation to the digital value being one of greater than an upper threshold value and lower than a lower threshold value.

2. The receiver of claim 1, wherein the circuitry that conditions the wireless signal includes an amplifier.

3. The receiver of claim 1, wherein the circuitry that conditions the wireless signal includes a mixer.

4. The receiver of claim 3, wherein the mixer mixes the wireless signal directly to baseband.

5. A device comprising:
   means for conditioning a wireless signal into a conditioned signal based on a current gain state, the current gain state being one of a plurality of discrete gain states for conditioning the signal;
   means for converting the conditioned signal to a digital value;
   means for directly comparing the digital value to an upper threshold value and a lower threshold value; and
   means for choosing a selected gain state based on the direct comparison of the digital value to the upper threshold value and the lower threshold value,
   wherein the selected gain state is selected from a sequence of discrete gain states,
   wherein the selected gain state is lower in the sequence than the current gain state when the digital value provided by the analog-to-digital converter is greater than the upper threshold value,
   wherein the selected gain state is higher in the sequence than the current gain state when the digital value provided by the analog-to-digital converter is less than a lower threshold value, and
   wherein the upper threshold value is greater than the lower threshold value.

6. The device of claim 5, further comprising means for filtering the digital value, wherein the means for choosing the selected gain state selects the selected gain state based on a filtered digital value.

7. The device of claim 5, wherein the means for conditioning includes means for mixing the wireless signal.

8. The device of claim 7, wherein in the means for mixing includes means for mixing the wireless signal directly to baseband.

9. The device of claim 7, wherein the means for conditioning includes means for scaling the wireless signal.

10. A computer readable medium comprising computer executable instructions that, when executed in a wireless device having a current gain state and an upper threshold value that is greater than a lower threshold value, cause the wireless device to:
   select a gain state to condition a received wireless signal into a conditioned signal, the selected gain state being one of a plurality of a sequence of discrete gain states for conditioning the signal;
   make a direct comparison of a digital value to the upper threshold value and the threshold value, the digital value being generated by an analog-to-digital converter that receives the conditioned signal as input; and
   choose a selected gain state based on the direct comparison of the digital value to the upper and lower threshold values,
   wherein, if the digital value is greater than the upper threshold value, the selected gain state is the gain state that is immediately lower in the sequence than the current gain state, wherein, if the digital value is less than the lower threshold value, the selected gain state is the gain state that is immediately higher in the sequence than the current gain state; and set the current gain state to the selected gain state.

11. The computer readable medium of claim 10, the digital value being a filtered digital value, the filtered digital value being generated by an analog-to-digital converter that receives the conditioned signal as input and a digital filter that filters the output of the analog-to-digital converter.

12. The computer readable medium of claim 10, wherein the digital value is provided by a digital-to-analog converter and the upper threshold is chosen to indicate saturation of the analog-to-digital converter.

13. The computer readable medium of claim 10, wherein the instructions when executed cause the wireless device to select the current gain state based on the digital value to increase gain when the digital value is below the lower threshold.

14. The computer readable medium of claim 10, wherein the instructions when executed cause the wireless device to select the current gain state based on the digital value to reduce gain when the digital value is above the upper threshold.

15. A method for executing instructions in a wireless device having a current gain state and an upper threshold value that is greater than a lower threshold value, the method comprising:

selecting a gain state to condition a received wireless signal into a conditioned signal, the selected gain state being one of a plurality of a sequence of discrete gain states for conditioning the signal;

making a direct comparison of a digital value to the upper threshold value and the threshold value, the digital value being generated by an analog-to-digital converter that receives the conditioned signal as input; and choosing a selected gain state based on the direct comparison of the digital value to the upper and lower threshold values, wherein, if the digital value is greater than the upper threshold value, the selected gain state is the gain state that is immediately lower in the sequence than the current gain state, wherein, if the digital value is less than the lower threshold value, the selected gain state is the gain state that is immediately higher in the sequence than the current gain state; and setting the current gain state to the selected gain state.

\* \* \* \* \*